US012632126B2

(12) United States Patent
    Hiraki

(10) Patent No.: US 12,632,126 B2
(45) Date of Patent: May 19, 2026

(54) INPUT DEVICE AND CONTROL METHOD OF INPUT DEVICE

(71) Applicant: TOPRE CORPORATION, Tokyo (JP)

(72) Inventor: Seiji Hiraki, Sagamihara (JP)

(73) Assignee: TOPRE CORPORATION, Tokyo (JP)

( * ) Notice: Subject to any disclaimer, the term of this patent is extended or adjusted under 35 U.S.C. 154(b) by 0 days.

(21) Appl. No.: 19/026,837

(22) Filed: Jan. 17, 2025

(65) Prior Publication Data

US 2025/0271946 A1      Aug. 28, 2025

(30) Foreign Application Priority Data

Feb. 28, 2024   (JP) ................................. 2024-028514

(51) Int. Cl.
    *G06F 3/023*       (2006.01)
    *H03K 17/96*       (2006.01)
(52) U.S. Cl.
    CPC ........... *G06F 3/023* (2013.01); *H03K 17/962* (2013.01)
(58) Field of Classification Search
    CPC ............................... G06F 3/023; H03K 17/962
    See application file for complete search history.

(56) References Cited

U.S. PATENT DOCUMENTS 6,278,384 B1    8/2001  Ide
9,864,507 B2 *  1/2018  Cheng ................. G06F 3/04883

2019/0065720 A1 *   2/2019   Lin .......................... G06F 3/023
2019/0243466 A1     8/2019   Sato et al.
2020/0050284 A1 *   2/2020   Toyosawa .............. H01H 13/83
2021/0379487 A1    12/2021   Huffer et al.
2022/0197401 A1 *   6/2022   Cheng ................... G06F 1/1626
2022/0334681 A1 *  10/2022   Suto .................... G06F 3/04146
2024/0115936 A1     4/2024   Huffer et al.

FOREIGN PATENT DOCUMENTS

JP          H11-85362 A      3/1999
JP          2022-505384 A    1/2022
KR      10-2019-0067206 A    6/2019
KR         10-2473413 B1    12/2022

* cited by examiner

*Primary Examiner* — Amit Chatly
(74) *Attorney, Agent, or Firm* — METROLEX IP LAW GROUP, PLLC; Robert L. Scott, Esq.

(57)                    ABSTRACT

An input device (100) includes a key (Ky); a pressing amount detection unit (51), an A/D conversion unit (14), a memory unit (12), and a main control unit (11). The main control unit (11) includes: a pressing determination unit (111) that, when outputting information indicating that the key (Ky) has not been pressed, and then when a detected value of the pressing amount is equal to or larger than an ON-threshold value, changes the information to information indicating that the key (Ky) has been pressed, and outputs the information, and when outputting information indicating that the key (Ky) has been pressed, and then when the detected value of the pressing amount is less than an OFF-threshold value, changes the information to information indicating that the key (Ky) has not been pressed, and outputs the information.

5 Claims, 7 Drawing Sheets

INPUT DEVICE AND CONTROL METHOD OF INPUT DEVICE

CROSS-REFERENCE TO RELATED APPLICATIONS

The present application is based on, and claims priority from, Japanese Patent Application No. 2024-028514, filed on Feb. 28, 2024, the entire contents of which are incorporated herein by reference.

TECHNICAL FIELD

The present disclosure relates to an input device and a control method of the input device.

BACKGROUND

In an e-sport where a plurality of users compete in a game, a key switch device such as a controller or a keyboard operated by each user is used, for example. During the e-sport, each user performs many operations such as repeatedly pressing the same key among various keys mounted on the key switch device. Higher operation speed of the same key (the number of inputs is high per fixed time) often leads to victory in a game. Therefore, the appearance of a key switch device that enables faster input operations is desired.

Further, in an e-sport or an arcade game, keys mounted on a keyboard or a game controller are used instead of joysticks for direction input. Arrow keys in four directions are used to operate in up, down, left, and right directions, for example.

In such a case, if a user presses keys for operating in two opposite directions simultaneously, such as an up direction and a down direction, both key operations are invalid in terms of software. The user is required to operate a direction operation key quickly. Due to this, the user is likely to press two keys simultaneously, and in this case, the user is not able to perform a direction input operation. The user is not able to input a next input key (for example, an arrow pointing to the right) unless the user releases a key input earlier (for example, an arrow pointing to the left). This causes a time lag when a direction is changed.

Japanese Patent Application Publication No. 2022-505384 discloses a "first input priority" in which the first pressed button always overwrites the second pressed button, and a "second input priority" in which the second pressed button always overwrites the first pressed button.

In the second input priority, among two opposing keys, it is possible to press the next key for input without returning a key pressed earlier. This enables quick input (for example, reversing a direction of travel, or the like).

SUMMARY OF THE INVENTION

However, in the technology disclosed in Japanese Patent Application Publication No. 2022-505384, conventional contact type keys are used. Therefore, operation points from an ON state to an OFF state, and from an OFF state to an ON state, are fixed. This has a problem that a user is not able to perform a quick input operation.

The present disclosure has been made to solve the above problem, and an object of the present disclosure is to provide an input device and a control method of the input device that enable high-speed continuous input.

An input device according to an aspect of an embodiment includes: a key that outputs a signal according to at least two pressing amounts; a pressing amount detection unit that detects a pressing amount of the key; an A/D conversion unit that converts the pressing amount of the key into digital data; a memory unit that stores the digital data; and a main control unit that determines whether the key has been pressed or whether the key has not been pressed, based on the pressing amount of the key, and outputs information, in which the main control unit includes: a pressing determination unit that, when outputting information indicating that the key has not been pressed, and then when a detected value of the pressing amount is equal to or larger than an ON-threshold value, which is larger than a local minimum value of the pressing amount by a predetermined ON-hysteresis, changes the information to information indicating that the key has been pressed, and outputs the information, and when outputting information indicating that the key has been pressed, and then when the detected value of the pressing amount is less than an OFF-threshold value, which is smaller than a local maximum value of the pressing amount by a predetermined OFF-hysteresis, changes the information to information indicating that the key has not been pressed, and outputs the information.

A control method of an input device according to another aspect of the embodiment performed by a computer, the control method including: a step of detecting a pressing amount of a key that outputs a signal according to at least two pressing amounts, by means of a pressing amount detection unit; a step of converting the pressing amount of the key into digital data, by means of an A/D conversion unit; a step of storing the digital data, by means of a memory unit; a step of, when outputting information indicating that the key has not been pressed, and then when a detected value of the pressing amount is equal to or larger than an ON-threshold value, which is larger than a local minimum value of the pressing amount by a predetermined ON-hysteresis, changing the information to information indicating that the key has been pressed, and outputting the information, by means of a pressing determination unit; and a step of, when outputting information indicating that the key has been pressed, and then when the detected value of the pressing amount is less than an OFF-threshold value, which is smaller than a local maximum value of the pressing amount by a predetermined OFF-hysteresis, changing the information to information indicating that the key has not been pressed, and outputting the information, by means of the pressing determination unit.

According to the above configuration, high-speed continuous input is enabled.

DETAILED DESCRIPTION

Description of Embodiment

Figure 1:
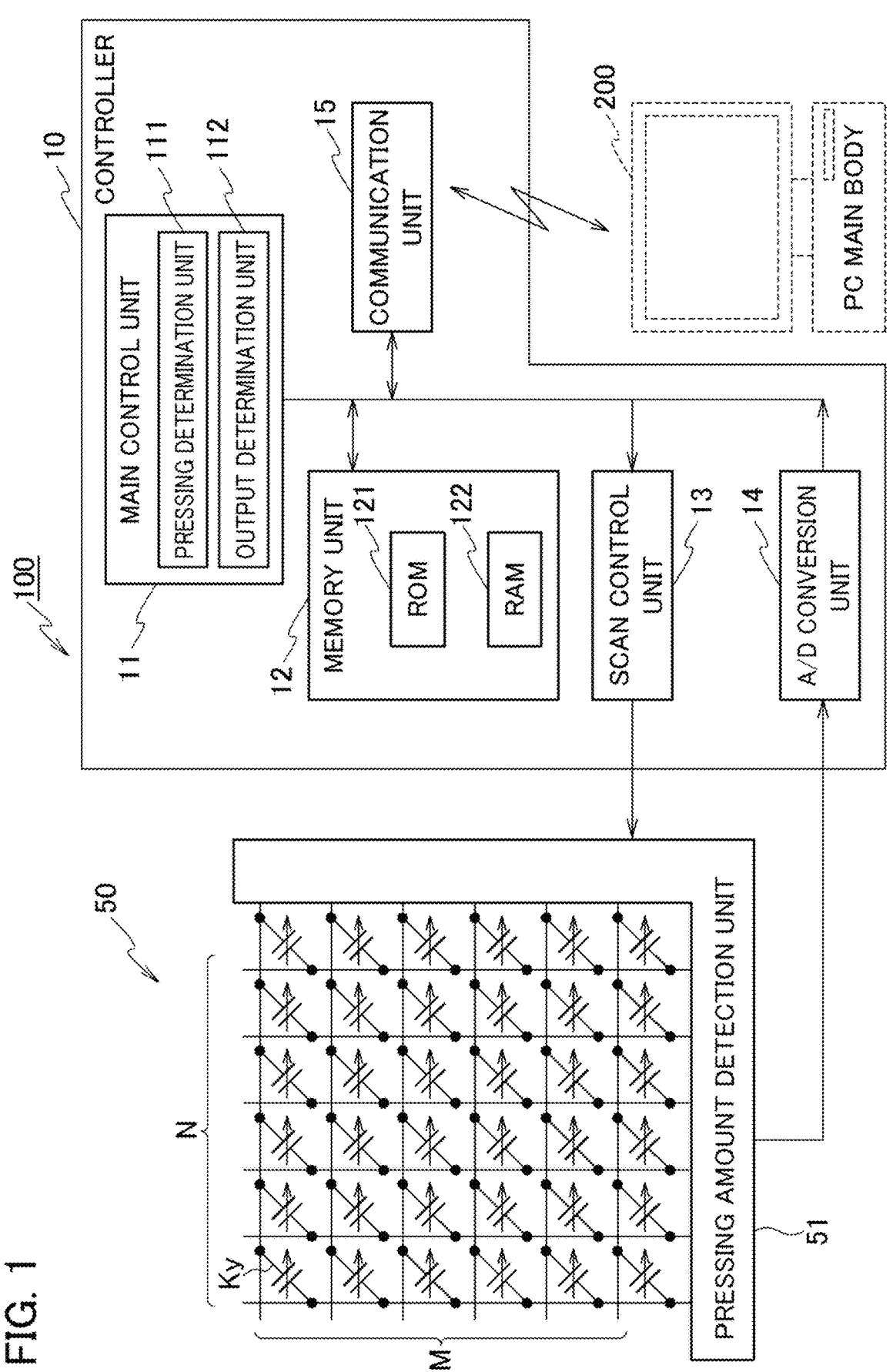
FIG. 1 is a block diagram illustrating configurations of an input device according to an embodiment and peripheral equipment thereof.

An embodiment of the present disclosure will be described below with reference to the drawings. FIG. 1 is a block diagram illustrating configurations of an input device 100 according to the present embodiment, and peripheral equipment thereof. More specifically, the input device is a computer keyboard with a large number of keys.

As illustrated in FIG. 1, the input device 100 according to the present embodiment includes a controller 10 and a key matrix 50.

The key matrix 50 includes a plurality of keys Ky connected to a plurality of drive lines M, and a plurality of sensing lines N. The key matrix 50 includes a pressing amount detection unit 51 which scans each key Ky and detects the pressing amount of each key Ky.

Each key Ky has electrodes which are located blow a keytop thereof, and which face the keytop. When the keytop is pressed, the capacitance changes. That is, each key Ky outputs a signal according to the pressing amount. Each key Ky outputs a signal according to at least two pressing amounts. The two pressing amounts are a key not being pressed (off) and a key being pressed (on), for example. The configuration of each key Ky will be described below with reference to FIGS. 2 and 3.

Figure 2:
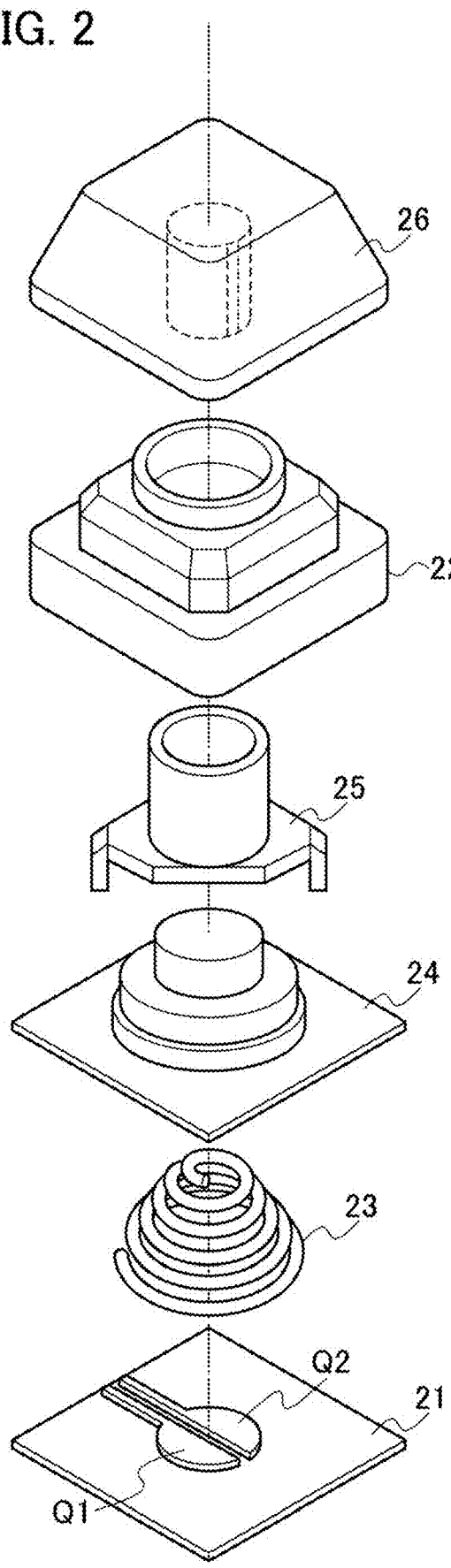
FIG. 2 is an exploded perspective view illustrating a structure of a key.
Figure 3:
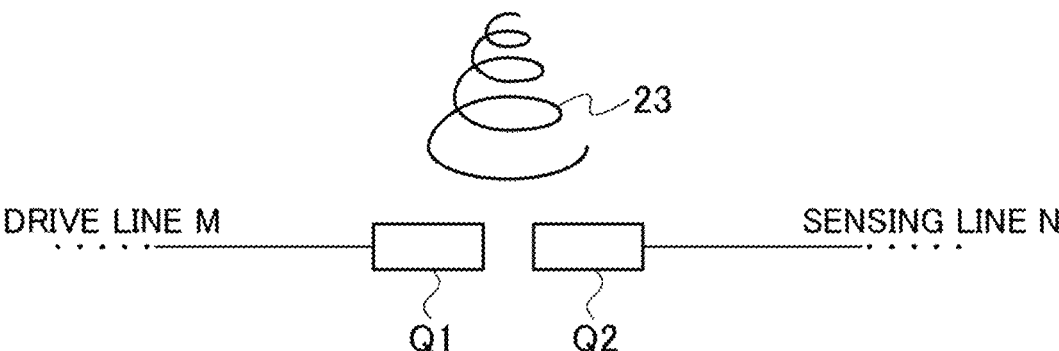
FIG. 3 is an explanatory diagram illustrating how the capacitance between two electrodes Q1 and Q2 changes according to the expansion or contraction of a coil spring.

As illustrated in FIG. 2, each key Ky includes a substrate 21 with a pair of electrodes Q1 and Q2, and a housing 22. A conical coil spring 23, a flexible rubber piece 24, and a plunger 25 are interposed between the substrate 21 and the housing 22. The electrodes Q1 and Q2 and the coil spring 23 are electrically insulated by an insulating layer (not illustrated), and therefore they constitute the capacitance.

Further, a keytop 26 is disposed above the housing 22. Due to an operator pressing the keytop 26, the coil spring 23 is biased, and the capacitance between the electrodes Q1 and Q2 changes accordingly. That is, each key Ky is configured such that the capacitance between the electrodes Q1 and Q2 increases according to the pressing amount when the operator presses the keytop 26.

A structure of a key Ky illustrated in FIG. 2 is not particularly specified, and it is sufficient if the key is configured such that the capacitance between the electrodes increases according to the pressing amount when the operator presses the keytop 26. Further, it is sufficient if the key is configured such that an output, more specifically, an analog voltage, monotonically increases according to the pressing amount of the key.

One electrode Q1 of the two electrodes Q1 and Q2 disposed in the key Ky described above is connected to a drive line M, and the other electrode Q2 is connected to a sensing line N. More specifically, as illustrated in a schematic diagram of FIG. 3, the electrodes Q1 and Q2 are arranged to face each other with a fixed distance therebetween. The electrode Q1 is connected to the drive line M, and the electrode Q2 is connected to the sensing line N. The capacitance between the electrodes Q1 and Q2 changes according to an expansion or contraction state of the coil spring 23 interposed between the two electrodes Q1 and Q2 (that is, the pressing amount of the keytop 26 illustrated in FIG. 2). Therefore, in accordance with this, the amount of electric charge that can be held between the electrodes Q1 and Q2 changes. Therefore, a voltage detected by the pressing amount detection unit 51 (see FIG. 1) changes.

In addition to a capacitive key switch, an analog input device capable of outputting the pressing amount as the analog amount, such as an electromagnetic type, an optical type, or an electric resistance type, may be used, for example. It is preferable to use an analog input device in which the output analog amount is linear relative to the pressing amount.

The pressing amount detection unit 51 illustrated in FIG. 1 detects the capacitance generated in each key Ky, selects one key Ky sequentially from a plurality of keys Ky, and detects the pressing amount of the selected key Ky. The pressing amount detection unit 51 outputs the detected pressing amount (analog value) data to an A/D conversion unit 14.

The controller 10 includes a main control unit 11, a memory unit 12, a scan control unit 13, the A/D conversion unit 14, and a communication unit 15. The controller 10 can be configured as an integrated computer including a central processing unit (CPU), and storage means such as storage and a hard disk, for example.

The main control unit 11 controls the scan control unit 13 to scan each key Ky, performs control of writing and reading data into and from the memory unit 12, and controls the communication unit 15 to communicate with a PC main body 200. The main control unit 11 acquires an initial operation value transmitted from the PC main body 200, and stores the value in an RAM 122 (details thereof will be described later). The main control unit 11 includes a pressing determination unit 111 and an output determination unit 112.

The pressing determination unit 111 determines whether each key Ky is pressed (hereinafter referred to as "ON state") and whether each key is not pressed (hereinafter referred to as "OFF state"), based on a digital signal output from the A/D conversion unit 14, and local maximum and local minimum values of the pressing amount of a key Ky stored in the memory unit 12 (details thereof will be described later).

The pressing determination unit 111 detects the pressing amount when the pressing amount of a key Ky, which had been increasing, decreases (this is referred to as a "local maximum value"), and stores the detected local maximum value in the RAM 122. The pressing determination unit 111 detects the pressing amount when the pressing amount of a key Ky, which had been decreasing, increases (this is referred to as a "local minimum value"), and stores the detected local minimum value in the RAM 122. When the pressing amount of a key Ky is represented by digital numerical values from 0 to 255, local maximum and local minimum values when a key Ky is operated are stored as the numerical values from 0 to 255, for example.

The pressing determination unit 111 sets a point at which the pressing amount is smaller than the local maximum value by a predetermined OFF-hysteresis amount as an OFF-threshold value, when an output from a key Ky is switched from the ON state to the OFF state. Alternatively, the pressing determination unit 111 sets a point at which the pressing amount is larger than the local minimum value by a predetermined ON-hysteresis amount as an ON-threshold value, when an output from a key Ky is switched from the OFF state to the ON state. The pressing determination unit 111 stores the above-described OFF-threshold value and ON-threshold value in the RAM 122. The OFF-hysteresis and ON-hysteresis may be in a relationship of "(OFF-hysteresis)≥(ON-hysteresis)", and preferably may be in a relationship of "(OFF-hysteresis)>(ON-hysteresis)". The OFF-hysteresis is 0.8 mm, for example, and the ON-hysteresis is about 0.6 mm, for example.

That is, when a key Ky is in the ON state, the pressing amount of the key Ky decreases. When the pressing amount becomes less than the OFF-threshold value, an output from the key Ky, which had been in the ON state, becomes in the OFF state. When a key Ky is in the OFF state, the pressing amount of the key Ky increases. When the pressing amount becomes the ON-threshold value or more, the key Ky, which had been in the OFF state, becomes in the ON state.

Further, the pressing determination unit 111 determines whether a key Ky has been pressed (ON state or OFF state), based on the pressing amount input using the key Ky. When the pressing amount of the key Ky detected by the pressing amount detection unit 51 is smaller than an initial operation value determined in advance (more specifically, an initial operation ON value or an initial operation OFF value which will be described later), the pressing determination unit 111 causes an output from the key Ky to be in the OFF state, regardless of the above-described OFF-hysteresis and ON-hysteresis.

Two values of the initial operation ON value and the initial operation OFF value are set as the initial operation values, and the initial operation ON value and the initial operation OFF value have a relationship of "(initial operation ON value)≥(initial operation OFF value)". An initial operation value (for example, 0.8 mm) is set in advance at a desired position of a pressing stroke (for example, 0 mm to 4 mm) of the key Ky, for example. In consideration of the hysteresis, the initial operation ON value is set to the pressing amount of 0.9 mm, and the initial operation OFF value is set to the pressing amount of 0.7 mm. By setting the initial operation value, it is possible to prevent erroneous detection of the key Ky, when a user presses down the key Ky slightly by accidentally touching the key Ky.

The output determination unit 112 determines pressing information to be output to the PC main body 200, based on pressing information of two arbitrary keys Ky. Suppose that the output determination unit 112 acquires ON information of both keys Ky (for example, a left operation key and a right operation key) from the pressing determination unit 111. In the above case, the output determination unit 112 outputs, to the PC main body 200, only ON information of a key Ky which has been placed in the ON state later. Therefore, suppose that the user switches from a rightward operation to a leftward operation, and a rightward operation input and a leftward operation input overlap, for example. In the above case, the later leftward operation input is preferentially output to the PC main body 200.

The memory unit 12 includes a Read Only Memory (ROM) 121 and a Random Access Memory (RAM) 122. The ROM 121 stores a control program for an entire device.

The RAM 122 stores pressing amount information of each key Ky. The RAM 122 stores, as a local maximum value, the pressing amount when the pressing amount of a key Ky, which had been increasing, decreases. Further, the RAM 122 stores, as an OFF-threshold value, the pressing amount smaller than the local maximum value by the above-described OFF-hysteresis. The RAM 122 stores, as a local minimum value, the pressing amount when the pressing amount of a key Ky, which had been decreasing, increases. Further, the RAM 122 stores, as an ON-threshold value, the pressing amount larger than the local minimum value by the above-described ON-hysteresis. The RAM 122 also stores the above-described initial operation ON value and initial operation OFF value.

The scan control unit 13, based on an instruction output from the main control unit 11, sequentially selects an address of each of the keys Ky arranged in a matrix, and scans each key Ky. Due to the scan control unit 13 scanning each key Ky, a voltage according to the capacitance generated in each key Ky is detected by the pressing amount detection unit 51.

The A/D conversion unit 14 converts the pressing amount of each key Ky output from the pressing amount detection unit 51 (analog data) into digital data from 0 to 255, for example. The A/D conversion unit 14 outputs the converted pressing amount (digital data) to the main control unit 11.

The communication unit 15 communicates with the PC main body 200 in a wireless or wired manner. Specifically, the communication unit 15 transmits, to the PC main body 200, information on whether each key Ky is in the ON state or the OFF state. Further, the communication unit 15 receives various set value data set by the PC main body 200.

Figure 4:
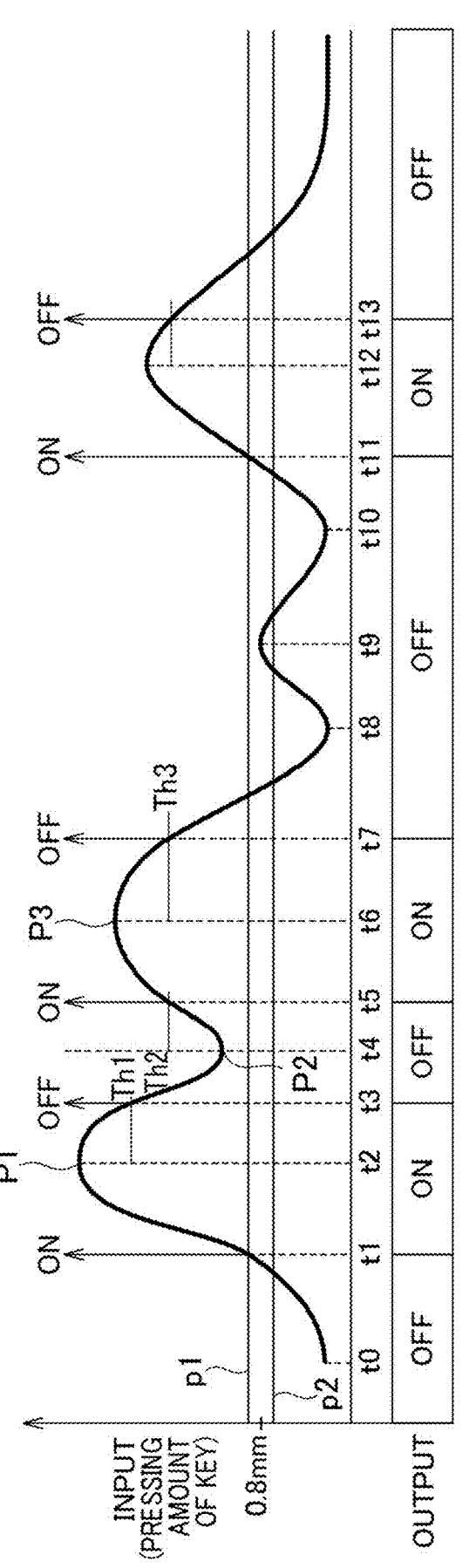
FIG. 4 is a timing chart illustrating a relationship between the pressing amount and operations of switching between an ON state and an OFF state in the input device according to the embodiment.

Next, the pressing amount of a key Ky, and an operation of switching between the ON state and the OFF state, in the input device 100 according to the present embodiment will be described with reference to a timing chart illustrated in FIG. 4. In FIG. 4, a horizontal axis represents time, and a vertical axis represents the pressing amount of a key Ky. That is, the longer the vertical axis direction, the larger the pressing amount of a key Ky. A stroke of a key Ky is from 0 mm to 4 mm, for example.

The determination as to whether a key Ky has been pressed (ON state) or has not been pressed (OFF state) is made by performing an initial operation control and a pressing determination control. In the initial operation control, an operation of switching between the ON state and the OFF state is not performed, regardless of a change in the pressing amount, in a region where the pressing amount of a key Ky is smaller than an initial operation value (initial operation ON value p1, and initial operation OFF value p2). When the pressing amount of a key Ky increases to reach the initial operation ON value p1 or more, a state of the key Ky is switched from the OFF state to the ON state. When the pressing amount of a key Ky decreases to become less than the initial operation OFF value p2, a state of the key Ky is switched from the ON state to the OFF state. Meanwhile, in the pressing determination control, a state of a key Ky is switched between the ON state and the OFF state according to the pressing amount of the key Ky.

In an initial stage, a key Ky is not pressed, and is in the OFF state. The main control unit 11 performs the initial operation control at the time of startup. Therefore, if the pressing amount is less than the initial operation ON value p1 (for example, 0.9 mm), even if the user accidentally touches the key Ky, the OFF state is continued. That is, this can prevent the key Ky from being switched from the OFF state to the ON state due to an erroneous operation performed by the user.

When an arbitrary key Ky starts to be pressed at time to illustrated in FIG. 4, the pressing amount gradually increases. When the pressing amount reaches the initial operation ON value p1 at time t1, a state of the key Ky changes from the OFF state to the ON state.

That is, the pressing amount output from the pressing amount detection unit 51 illustrated in FIG. 1 is digitized by the A/D conversion unit 14, and the thus obtained digital signal is supplied to the pressing determination unit 111. The pressing determination unit 111 compares the digital signal with the initial operation ON value p1 stored in the RAM 122, and if the pressing determination unit 111 determines that the digital signal is more than the initial operation ON value p1, the pressing determination unit 111 switches a state of the key Ky from the OFF state to the ON state. The main control unit 11 switches an output control of the key Ky from initial operation control to pressing determination control. Here, the RAM 122 stores the pressing amount at that time as the maximum pressing value for the subsequent input priority control to be performed later. More specifically, the RAM 122 stores the initial operation ON value p1.

When the key Ky is in the ON state, the pressing determination unit 111 acquires the maximum value of the pressing amount. That is, the pressing determination unit 111 compares the pressing amount of the key Ky successively transmitted from the A/D conversion unit 14, with the maximum pressing value stored in the RAM 122. If the newly input pressing amount is larger than the maximum pressing value, the pressing determination unit 111 causes the RAM 122 to store the newly input pressing amount as the new maximum pressing value. In this way, it is possible to detect the local maximum value when the pressing amount, which had been increasing, decreases. That is, if the newly input pressing amount is less than the maximum pressing value, it is possible to detect that the maximum pressing value at that time is the local maximum value.

If the key Ky is pressed continuously, and the pressing amount, which had been increasing, decreases at time t2, the main control unit 11 causes the RAM 122 to store the maximum value of the pressing amount at that time as the local maximum value P1. The main control unit 11 sets a point smaller than the local maximum value P1 by an OFF-hysteresis (for example, 0.8 mm) as a next OFF-threshold value Th1, and causes the RAM 122 to store the value.

The pressing determination unit 111 compares the pressing amount of the key Ky successively transmitted from the A/D conversion unit 14, with the OFF-threshold value Th1 stored in the RAM 122. When the pressing amount decreases to be equal to the OFF-threshold value Th1 at time t3, the pressing determination unit 111 determines that the key Ky has been returned, and switches a state of the key Ky from the ON state to the OFF state. That is, a state of the key Ky can be switched from the ON state to the OFF state merely by the user returning the pressing amount of the key Ky about 0.8 mm (OFF-hysteresis) from the local maximum value P1. The pressing determination unit 111 causes the RAM 122 to store the pressing amount at this time as the minimum pressing value.

After an output of the key Ky is switched to the OFF state at time t3, the pressing determination unit 111 acquires the minimum value of the pressing amount of the key Ky. That is, the pressing determination unit 111 compares the pressing amount of the key Ky successively transmitted from the A/D conversion unit 14, with the minimum pressing value stored in the RAM 122. When the newly input pressing amount is smaller than the minimum pressing value, the pressing determination unit 111 causes the RAM 122 to store the newly input pressing amount as the new minimum pressing value.

Suppose that the pressing amount of the key Ky continuously decreases and the pressing amount, which had been decreasing, increases at time t4 due to the user pressing the key Ky. In the above case, the pressing determination unit 111 causes the RAM 122 to store the minimum pressing value at this time, as the local minimum value P2. The pressing determination unit 111 sets a point larger than the local minimum value P2 by an ON-hysteresis (for example, 0.6 mm) as a next ON-threshold value Th2, and causes the RAM 122 to store the value.

Thereafter, when the pressing amount of the key Ky becomes the ON-threshold value Th2 or more at time t5, an output of the key Ky changes from the OFF state to the ON state. That is, the user can switch a state of the key Ky from the OFF state to the ON state merely by pressing the key Ky about 0.6 mm (ON-hysteresis) from the local minimum value P2.

Thereafter, as described above, when the pressing amount reaches a local maximum value P3 at time t6, the pressing amount smaller than the local maximum value P3 by an OFF-hysteresis (for example, 0.8 mm) is set as an OFF-threshold value Th3. When the pressing amount becomes less than the OFF-threshold value Th3 at time t7, a state of the key Ky changes from the ON state to the OFF state.

Thereafter, when the pressing amount of the key Ky is less than the initial operation OFF value p2, and the key Ky is pressed at time t8, the pressing amount, which had been decreasing, increases. Even if the pressing amount becomes the local maximum value at time t9, since the pressing amount is less than the initial operation ON value p1, the OFF state of the output of the key Ky is maintained.

The pressing amount, which had been decreasing, increases at time t10, and the pressing amount becomes the initial operation ON value p1 or more at time t11. Thereafter, the output state of the key Ky changes from the OFF state to the ON state, the pressing amount becomes the local maximum value at time t12, and the output state of the key Ky changes from the ON state to the OFF state at time t13.

Figure 5A:
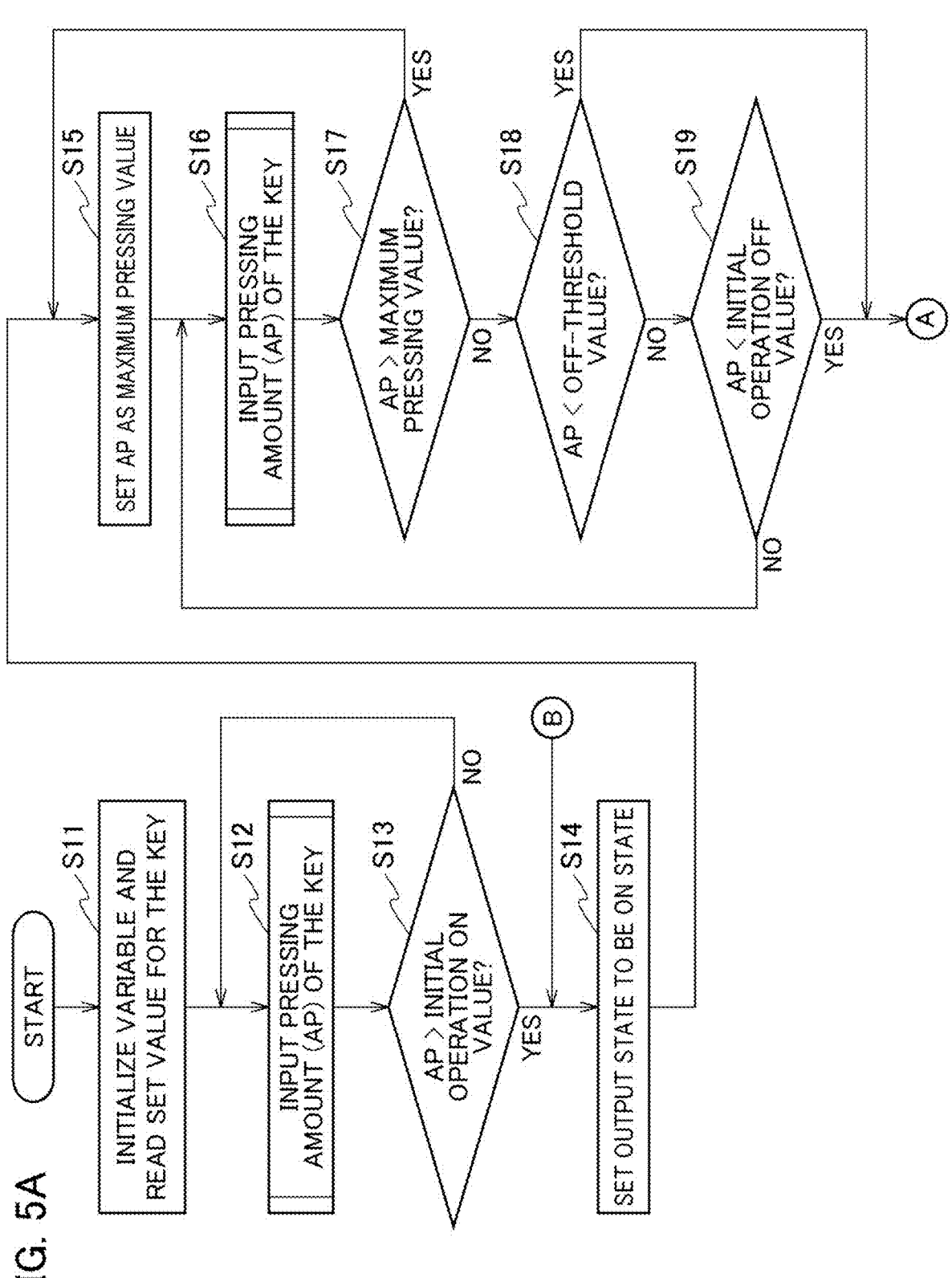
FIG. 5A is a first partial flowchart illustrating a processing procedure of the input device according to the embodiment.
Figure 5B:
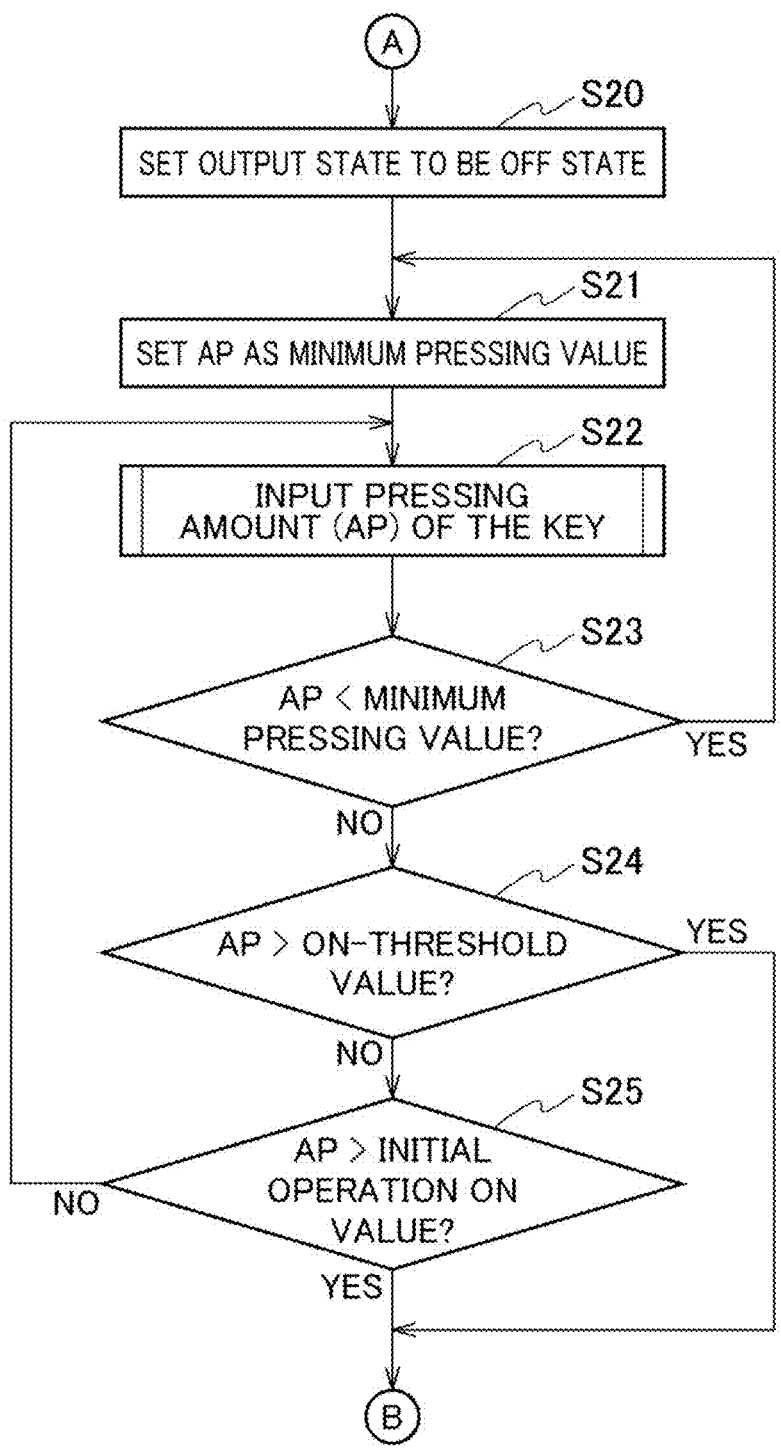
FIG. 5B is a second partial flowchart illustrating the processing procedure of the input device according to the embodiment.

Next, an operation of outputting the ON state or the OFF state of a key Ky of the input device 100 according to the present embodiment, configured as described above, will be described with reference to flowcharts illustrated in FIGS. 5A and 5B. The processing illustrated in FIGS. 5A and 5B is performed by the main control unit 11 illustrated in FIG. 1. Specifically, as illustrated in FIG. 1, the device has (M×N) keys Ky, and whether each key Ky is in the ON state or in the OFF state is determined successively. Since all controls for determining whether each key Ky is in the ON state or in the OFF state are the same, only one key Ky as a determination target will be described in the following description.

First, in step S11 of FIG. 5A, the pressing determination unit 111 initializes various variables used for the processing. Further, the unit sets a state of a key Ky to the "OFF" state. Still further, the unit reads a set value for the key Ky from the RAM 122. Specifically, the unit reads an initial operation ON value p1 and an initial operation OFF value p2 set for the key Ky.

In step S12, the pressing determination unit 111 acquires a pressing amount AP of the key Ky, which has been detected by the pressing amount detection unit 51 and has been digitized by the A/D conversion unit 14.

In step S13, the pressing determination unit 111 determines whether the pressing amount AP is larger than the initial operation ON value p1. If the pressing amount AP is larger than the initial operation ON value p1 (S13; YES), the processing proceeds to step 14. Alternatively, if the pressing amount AP is not larger than the initial operation ON value p1 (S13; NO), the processing returns to step S12.

In step S14, the pressing determination unit 111 sets an output state of the key Ky to be the ON state.

In step S15, the pressing determination unit 111 causes the RAM 122 to store the pressing amount AP as the maximum pressing value.

In step S16, the pressing determination unit 111 acquires the pressing amount AP of the key Ky, which has been detected by the pressing amount detection unit 51 and has been digitized by the A/D conversion unit 14.

In step S17, the pressing determination unit 111 determines whether the pressing amount AP is more than the maximum pressing value stored in the RAM 122. If the pressing amount AP is more than the maximum pressing value (S17; YES), the processing returns to step S15. If the pressing amount AP is the maximum pressing value or less (S17; NO), the processing proceeds to step S18. That is, if the pressing amount has increased, the maximum pressing value stored in the RAM 122 is updated to the newly input pressing amount AP.

In step S18, the pressing determination unit 111 sets the maximum pressing value stored in the RAM 122 at this time to be the local maximum value (FIG. 4; P1). Further, the pressing determination unit 111 sets a point smaller than the local maximum value by an OFF-hysteresis (for example, 0.8 mm) as a next OFF-threshold value (FIG. 4; Th1). Still further, the pressing determination unit 111 determines whether the pressing amount AP of the key Ky is less than the OFF-threshold value. If the pressing amount AP is less than the OFF-threshold value (S18; YES), the processing proceeds to step S20 in FIG. 5B. If the pressing amount AP is the OFF-threshold value or more (S18; NO), the processing proceeds to step S19.

In step S19, the pressing determination unit 111 determines whether the pressing amount AP is less than the initial operation OFF value p2. If the pressing amount AP is less than the initial operation OFF value p2 (S19; YES), the processing proceeds to step S20. If the pressing amount AP is the initial operation OFF value p2 or more (S19; NO), the processing returns to step S16.

In step S20 of FIG. 5B, the pressing determination unit 111 sets the output state of the key Ky to be the OFF state. That is, the pressing determination unit 111 sets the output state of the key Ky to be the OFF state, when the pressing amount of the key Ky becomes less than an OFF-threshold value, for example, when the pressing amount becomes less than the OFF-threshold value Th1 at time t3 as illustrated in FIG. 4. Further, when the pressing amount of the key Ky becomes less than the initial operation OFF value p2, the processing proceeds to the initial operation control described above, and the output state of the key Ky is set to be the OFF state.

In step S21, the pressing determination unit 111 sets the pressing amount AP at this time to the minimum pressing value and causes the RAM 122 to store the value.

In step S22, the pressing determination unit 111 acquires the pressing amount AP of the key Ky.

In step S23, the pressing determination unit 111 determines whether the pressing amount AP is less than the minimum pressing value stored in the RAM 122. If the pressing amount AP is less than the minimum pressing value (S23; YES), the processing returns to step S21. If the pressing amount AP is the minimum pressing value or more (S23; NO), the processing proceeds to step S24. That is, if the pressing amount decreases, the minimum pressing value stored in the RAM 122 is updated to the newly input pressing amount AP.

The pressing determination unit 111 sets the minimum pressing value stored in the RAM 122 at this time to the local minimum value (FIG. 4; P2), and further sets a point larger than the local minimum value by an ON-hysteresis (for example, 0.6 mm) to be a next ON-threshold value (FIG. 4; Th2) in step S24. Further, in step S24, the pressing determination unit 111 determines whether the pressing amount of the key Ky is more than an ON-threshold value. If the pressing amount is more than the ON-threshold value (S24; YES), the processing returns to step S14 in FIG. 5A. Alternatively, if the pressing amount is the ON-threshold value or less (S24; NO), the processing proceeds to step S25.

In step S25, the pressing determination unit 111 determines whether the pressing amount AP is more than the initial operation ON value p1. If the pressing amount AP is more than the initial operation ON value p1 (S25; YES), the processing returns to step S14 in FIG. 5A. Alternatively, if the pressing amount AP is the initial operation ON value p1 or less (S25; NO), the processing returns to step S22. In this way, the above-described initial operation control and pressing determination control are switched, and the ON state or the OFF state of the key Ky is output.

Next, a description will be given regarding how outputs are switched when two keys Ky (hereinafter referred to as key A and key B) having different operation directions are simultaneously pressed. A key A is a left key operated in a leftward direction, for example, and a key B is a right key operated in a rightward direction, for example.

Figure 6:
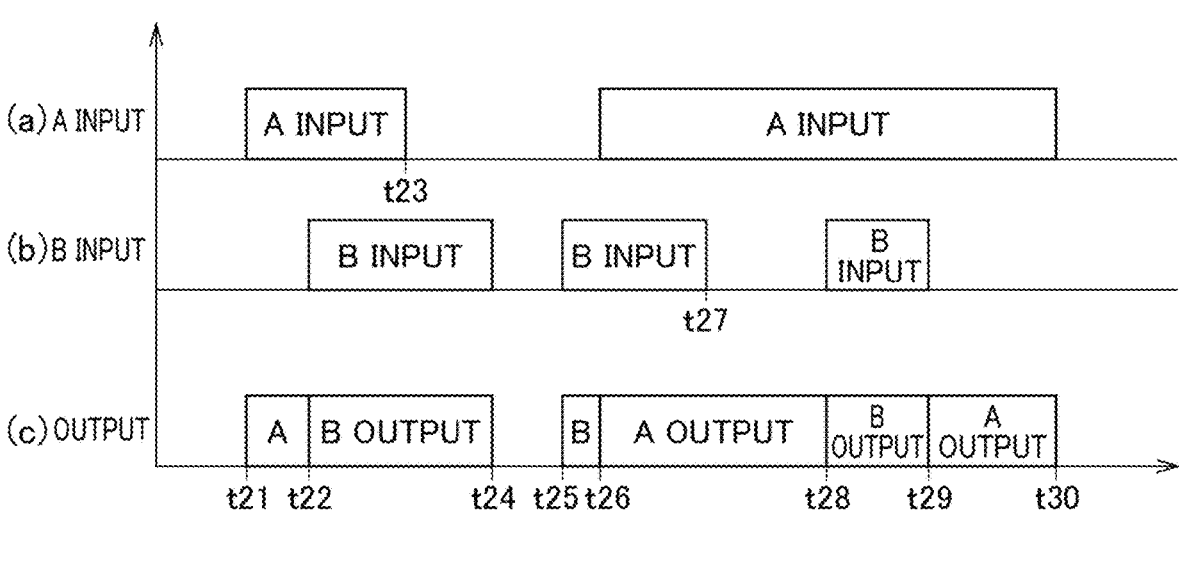
FIG. 6 is a timing chart illustrating an "ON operation" and an "OFF operation" of two keys and the change in outputs.

FIG. 6 is a timing chart illustrating the key A, the key B, and an output from the output determination unit 112. FIG. 6(*a*) illustrates an input operation of the key A, FIG. 6(*b*) illustrates an input operation of the key B, and FIG. 6(*c*) illustrates the output from the output determination unit 112. Processing is performed by the output determination unit 112 illustrated in FIG. 1.

When the key A is in the ON state at time t21 illustrated in FIG. 6, the output determination unit 112 outputs the ON state of the key A. When the key B is in the ON state at time t22, inputs of both the key A and the key B are detected. In this case, the output determination unit 112 outputs the ON state of the key B operated later.

Even if the key A is in the OFF state at time t23, the output determination unit 112 continues to set the key B to be in the ON state. If the key B is in the OFF state at time t24, the output determination unit 112 sets both the key A and the key B to be in the OFF state. If the key B is in the ON state at time t25, the output determination unit 112 outputs the ON state of the key B.

When the key A is in the ON state at time t26, inputs of both the key A and the key B are detected. In this case, the output determination unit 112 outputs the ON state of the key A operated later. Even if the key B is in the OFF state at time t27, the output determination unit 112 continues to output the ON state of the key.

When the key B is in the ON state at time t28, the output determination unit 112 preferentially outputs the ON state of the key B. When the key B is in the OFF state at time t29, the output determination unit 112 outputs the ON state of the key A. That is, when switching between the ON state and the OFF state of the key B is performed, while maintaining the ON state of the key A, an output of the key B is inserted into an output of the key A. When the key A is in the OFF state at time t30, the output determination unit 112 sets both the key A and the key B to be in the OFF state.

As described above, when two keys A and B having different directions are simultaneously pressed, the output determination unit 112 preferentially outputs an ON state of a key operated later. Therefore, suppose that the user presses a left key to perform a leftward operation and then presses a right key to switch the operation to a rightward operation, for example. In the above case, an ON state of the right key pressed later is preferentially output.

As examples of the two keys Ky having different operation directions, the left key and the right key have been described above, but the keys may be an upward key indicating an upward direction and a downward key indicating a downward direction. Although a description has been given regarding a case where the left key indicates the leftward direction and the right key indicates the rightward direction, an "A" key may indicate the leftward direction and a "D" key may indicate the rightward direction. Further, a "W" key may indicate the upward direction and an "S" key may indicate the downward direction. These settings may be fixed in advance, or may be changed by an operation after starting a system, or by an operation determined during use.

In this way, in the input device 100 according to the present embodiment, when the initial operation ON value p1 and the initial operation OFF value p2 are set, the pressing amount of the key Ky decreases to be less than the initial operation OFF value p2, and when the pressing amount of the key Ky increases but the pressing amount is less than the initial operation ON value p1, the key Ky is set to be in the OFF state by performing the initial operation control. Therefore, this can prevent erroneous detection of the key Ky when a slight pressing amount of the key Ky occurs due to the user accidentally touching the key Ky.

In the present embodiment, when the pressing amount of the key Ky increases to be the initial operation ON value p1 or more, the control is switched to the pressing determination control, and the key Ky state becomes the ON state. Further, a point when the pressing amount of the key Ky, which had been increasing, decreases is set as the local maximum value, and an OFF-threshold value is set based on this local maximum value. When the pressing amount of the key Ky becomes less than the OFF-threshold value, the output state of the key Ky is switched to be the OFF state. Therefore, if the pressing amount of the key Ky is returned by the OFF-threshold value when the key Ky is in the ON state, the user can switch a state of the key Ky to be the OFF state. That is, the user can set the key Ky to be in the OFF state immediately.

Alternatively, a point when the pressing amount of the key Ky, which had been decreasing, increases is set as a local minimum value, and an ON-threshold value is set based on the local minimum value. When the pressing amount of the key Ky becomes the ON-threshold value or more, the output state of the key Ky is switched to be the ON state. Therefore, if the key Ky is pressed by the ON-threshold value when the key Ky is in the OFF state, the user can switch a state of the key Ky to be the ON state. That is, the user can set the key Ky to be in the ON state immediately. Therefore, this can enhance the operability when the ON state and the OFF state of the key Ky are switched. If the key Ky is pressed repeatedly at high speed, a repetition operation of the ON state and the OFF state of the key Ky can be performed quickly.

In the present embodiment, when two keys having opposite operation directions are simultaneously pressed, an operation of a key input later is preferentially output. Therefore, this can prevent the simultaneous input of operations of the two keys having opposite operation directions. Further, a key input later can be quickly input without returning a key input earlier. This enables the user to reliably and quickly perform an operation of switching the directions. Furthermore, if one key Ky is pressed, and the other key having an opposite operation direction is pressed repeatedly at high speed, the two keys having the opposite operation directions can be switched and input at high speed.

In the description of above-described embodiment, an example of the input device is the keyboard with N×M keys Ky. However, the present embodiment is not limited to the keyboard, and can be applied to button portions of a game controller or an arcade controller. The difference merely resides in the number of keys Ky, and features except the above are similar to those of a keyboard for a computer.

Although the embodiment of the present disclosure has been described above, the discussion and drawings forming part of this disclosure should not be construed as limiting the embodiment. Various alternative embodiments, examples, and operational techniques will be apparent to those skilled in the art from this disclosure.

What is claimed is:

1. An input device comprising:
   a key that outputs a signal according to at least two pressing amounts;
   a pressing amount detection unit that detects a pressing amount of the key;
   an A/D conversion unit that converts the pressing amount of the key into digital data;
   a memory unit that stores the digital data; and
   a main control unit that determines whether the key has been pressed or whether the key has not been pressed, based on the pressing amount of the key, and outputs information, wherein
   the main control unit includes:
   a pressing determination unit that,
   when outputting information indicating that the key has not been pressed, and then when a detected value of the pressing amount is equal to or larger than an ON-threshold value, which is larger than a local minimum value of the pressing amount by a predetermined ON-hysteresis, changes the information to information indicating that the key has been pressed, and outputs the information, and when outputting information indicating that the key has been pressed, and then when the detected value of the pressing amount is less than an OFF-threshold value, which is smaller than a local maximum value of the pressing amount by a predetermined OFF-hysteresis, changes the information to information indicating that the key has not been pressed, and outputs the information,
   an initial operation OFF value, and an initial operation ON value that is larger than the initial operation OFF value, are set as initial operation values,
   when the pressing amount detected by the pressing amount detection unit is less than the initial operation ON value, the pressing determination unit outputs information indicating that the key has not been pressed, regardless of whether the pressing amount is equal to or larger than the ON-threshold value, and
   when the pressing amount detected by the pressing amount detection unit, which had been equal to or larger than the initial operation OFF value, decreases to be less than the initial operation OFF value, the pressing determination unit outputs information indicating that the key has not been pressed, regardless of whether the pressing amount is less than the OFF-threshold value.

2. The input device according to claim 1, wherein
   when the pressing amount detected by the pressing amount detection unit is less than a predetermined initial operation value, the pressing determination unit outputs information indicating that the key has not been pressed, regardless of whether the pressing amount is equal to or larger than the ON-threshold value, and
   when the pressing amount detected by the pressing amount detection unit, which had been equal to or larger than the predetermined initial operation value, decreases to be less than the predetermined initial operation value, the pressing determination unit outputs information indicating that the key has not been pressed, regardless of whether the pressing amount is less than the OFF-threshold value.

3. The input device according to claim 1, wherein the main control unit further includes an output determination unit that acquires outputs from the pressing determination unit for two keys, and that, only for a key determined to be pressed later among the two keys, outputs information indicating that the key has been pressed.

4. The input device according to claim 1, wherein the OFF-hysteresis is equal to or larger than the ON-hysteresis.

5. A control method of an input device performed by a computer, the control method comprising:

detecting a pressing amount of a key that outputs a signal according to at least two pressing amounts, by means of a pressing amount detection unit;

converting the pressing amount of the key into digital data, by means of an A/D conversion unit;

storing the digital data, by means of a memory unit;

a step when outputting information indicating that the key has not been pressed, and then when a detected value of the pressing amount is equal to or larger than an ON-threshold value, which is larger than a local minimum value of the pressing amount by a predetermined ON-hysteresis, changing the information to information indicating that the key has been pressed, and outputting the information; and when outputting information indicating that the key has been pressed, and then when the detected value of the pressing amount is less than an OFF-threshold value, which is smaller than a local maximum value of the pressing amount by a predetermined OFF-hysteresis, changing the information to information indicating that the key has not been pressed, and outputting the information, wherein an initial operation OFF value, and an initial operation ON value that is larger than the initial operation OFF value, are set as initial operation values, when the detected pressing amount is less than the initial operation ON value, information indicating that the key has not been pressed is output, regardless of whether the pressing amount is equal to or larger than the ON-threshold value, and when the detected pressing amount, which had been equal to or larger than the initial operation OFF value, decreases to be less than the initial operation OFF value, information indicating that the key has not been pressed is output, regardless of whether the pressing amount is less than the OFF-threshold value.

\* \* \* \* \*